United States Patent [19]

Mason et al.

[11] 4,013,208
[45] Mar. 22, 1977

[54] SOLDERING MECHANISM FOR SOLDERING ELECTRONIC COMPONENT LEADS TO CONDUCTORS ON A PRINTED CIRCUIT BOARD, AND THE LIKE

[75] Inventors: Richard Storrs Mason, Escondido; Robert Edward Bible, Rancho Santa Fe; James Robert Beach, Encinitas, all of Calif.

[73] Assignee: The Singer Company, Little Falls, N.J.

[22] Filed: Mar. 8, 1976

[21] Appl. No.: 664,775

[52] U.S. Cl. .................... 228/44.1 A; 219/85 D; 219/85 F
[51] Int. Cl.[2] .................................. H01L 21/60
[58] Field of Search ......... 228/6 A, 44.1 R, 44.1 A, 228/4.5; 219/85 D, 85 F, 87, 89

[56] References Cited

UNITED STATES PATENTS

| | | | |
|---|---|---|---|
| 2,486,319 | 10/1949 | Opitz | 219/87 |
| 3,275,794 | 9/1966 | Dubusker et al. | 228/44.1 R |
| 3,504,156 | 3/1970 | Bonner | 219/87 |
| 3,669,333 | 6/1972 | Coucoulas | 228/5.5 |
| 3,905,537 | 9/1975 | Schmehl | 228/44.1 A |

*Primary Examiner*—Al Lawrence Smith
*Assistant Examiner*—K. J. Ramsey
*Attorney, Agent, or Firm*—Thomas W. Kennedy

[57] ABSTRACT

A mechanism is provided for soldering the leads of electronic components, such as integrated circuit elements, to corresponding conductors on a printed circuit board. The mechanism utilizes the known lap soldering reflow process by which the leads of the electronic component and the printed circuit conductors are solder coated, and a heated soldering tip holds each component lead and the corresponding printed circuit conductor in contact with one another while melting the solder on the lead and on the conductor. The soldering tip continues to hold the lead and conductor in contact with one another after the heat in the tip has been terminated and until the solder solidifies. The soldering tip is then removed leaving a soldered joint. The mechanism of the invention, in the embodiment to be described, includes two multi-tip soldering heads which can be adjusted to any desired longitudinal separation and to any desired lateral position with respect to the printed circuit board so as to align the soldering tips with the leads of a wide variety of electronic components on the board of varying sizes and shapes. The mechanism of the invention also has the ability to activate and set any combination of soldering tips to the soldering position so as to align selected soldering tips, for example, with integrated circuit component leads of different numbers of varying spacings. Also, the soldering tips of the mechanism of the invention each undergoes a stress reducing cycle during the soldering operation to reduce subsequent solder joint failure.

9 Claims, 5 Drawing Figures

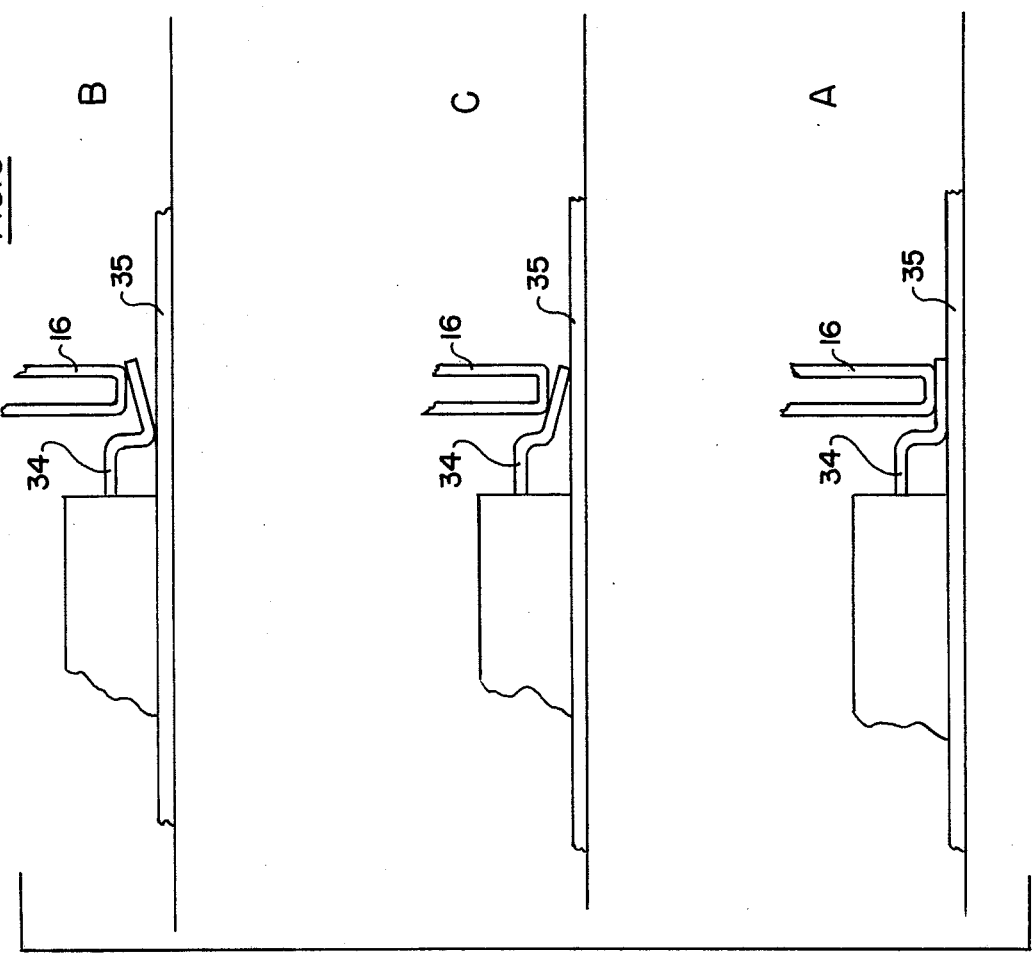
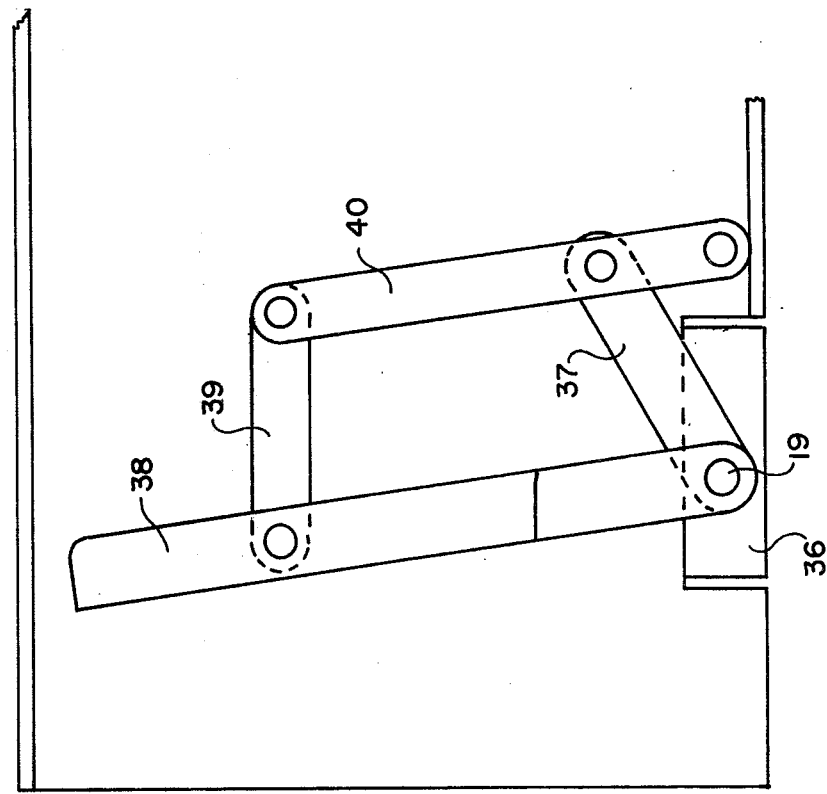

SOLDERING MECHANISM FOR SOLDERING ELECTRONIC COMPONENT LEADS TO CONDUCTORS ON A PRINTED CIRCUIT BOARD, AND THE LIKE

BACKGROUND OF THE INVENTION

Specialized machines are known to the art which are designed to solder electronic component leads to the conductors of printed circuit boards. However, the prior art machines, insofar as applicants are aware, have all been designed to handle only one lead configuration. Such prior art machines are not useful, therefore, for soldering purposes in cases where a variety of different types and sizes of electronic components are used in conjunction with a single printed circuit board. It has been found in the past, under the latter conditions, that the only practical technique is to hand solder the component leads on an individual basis, which is expensive and time consuming.

The prior art mechanisms, moreover, have a tendency to produce solder joints which contain high residual stresses, because the prior art machines do not include any means for relieving stresses during the individual soldering operations. The lack of a stress relieving means in the prior art machines creates solder joints which are prone to failure during temperature cycling and subsequent usage in the field.

The mechanism of the present invention, on the other hand, is designed to be capable of soldering on a simultaneous basis, the multiple leads of a wide variety of electronic components of different shapes and sizes. This feature permits the mechanism of the invention to be used in conjunction with assemblies in which electronic components of many sizes and having many different numbers of leads are to be soldered to the conductors of a particular printed circuit board.

Unlike the prior art machinery, the mechanism of the present invention can be moved from component to component, and can be adapted to solder the leads of each individual component on a simultaneous basis to the printed circuit conductors on the circuit board, regardless of the size of the component or of the number of leads, and without any need for time consuming changes in the basic set-up of the soldering mechanism.

Moreover, the soldering mechanism to be described incorporates a stress relieving cycle, by which the leads of the various electronic components are soldered to the printed circuit conductors on the circuit board under an environment of reduced stress, so that as the solder hardens at each joint, the stress within the soldered joint is minimized. In this way, the soldered joints made by the mechanism of the invention are not prone to failure during subsequent temperature cycling and field usage.

BRIEF DESCRIPTION OF THE DRAWINGS

FIG. 4 is a fragmentary elevational view showing a linkage which may be incorporated into each of the soldering head assemblies of FIG. 1 to cause the soldering tips to move along linear paths; and FIG. 5 is a group of three schematic diagrams showing the manner in which the mechanism of the invention undergoes a stress relieving cycle so as to create solder joints which are not prone to failure.

DETAILED DESCRIPTION OF THE ILLUSTRATED EMBODIMENT

Figure 1:
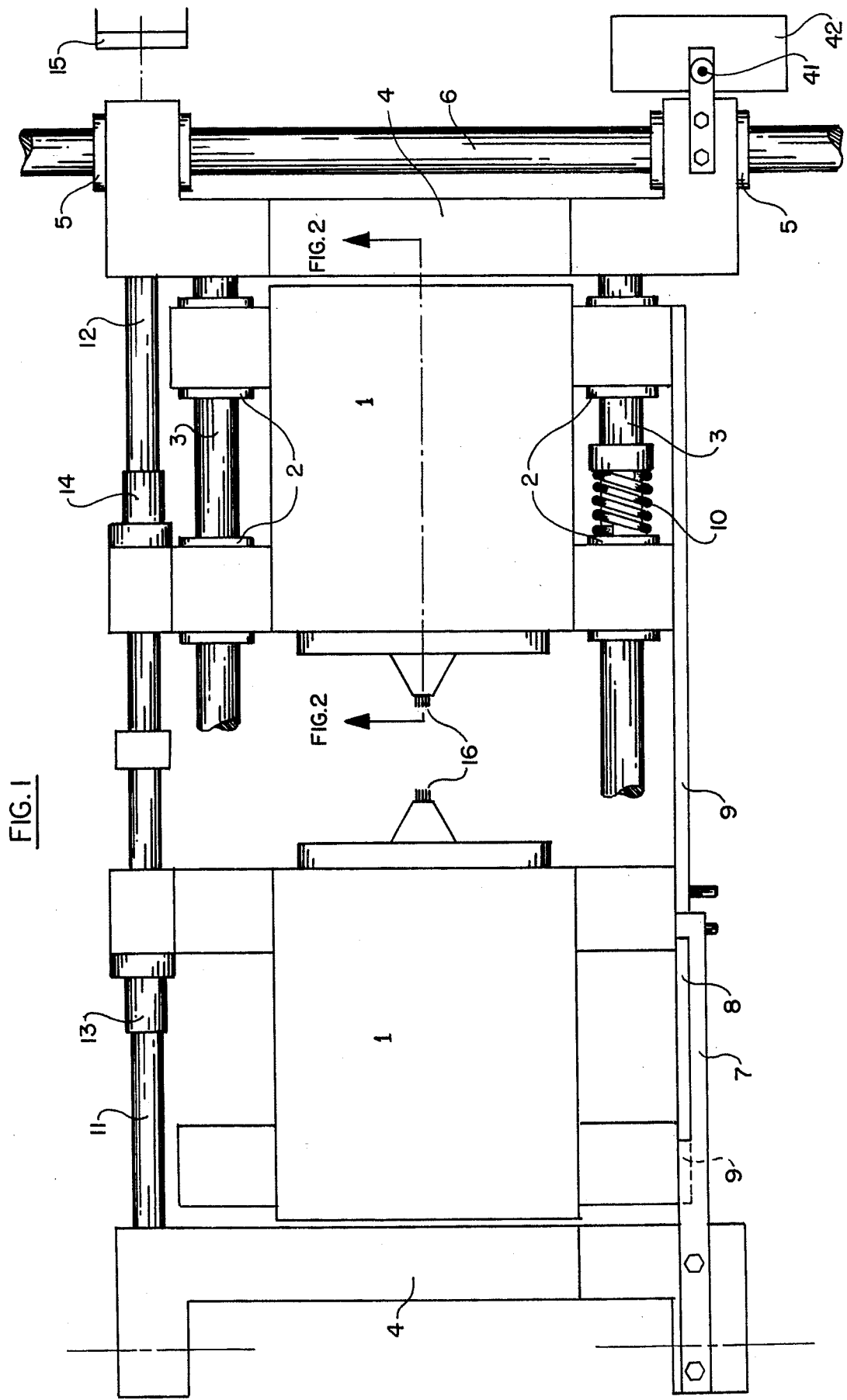
FIG. 1 is a top plan view of one embodiment of the soldering mechanism of the invention which incorporates two separate soldering head assemblies, the head assemblies being mounted for longitudinal and lateral movement with respect to the plane of the top surface of a printed circuit board.

As shown in FIG. 1, the illustrated embodiment of the invention includes two separate soldering head assemblies 1. Each soldering head assembly is mounted on linear ball bearings 2 which roll along respective guide bars 3 in a longitudinal direction in the plane of the top surface of the printed circuit board. The guide bars 3, in turn, are mounted on support blocks 4, and the support blocks are mounted in linear ball bearings 5 which roll in a lateral direction in the plane of the top surface of the printed circuit board along guide bars, such as the guide bar 6.

By means of the illustrated construction, both the soldering head assemblies 1 can be moved together laterally across the top surface of the printed circuit board to any desired lateral position on the board over a particular electronic component. The head assemblies 1 can then be moved independently in a lateral direction towards or away from one another to any desired lateral separation, so that the soldering tips mounted on each head may be positioned over the respective leads of the particular electronic component which are to be soldered to the printed circuit conductors on the board.

It will be evident that the assembly shown in FIG. 1 is capable of soldering any number of electronic components of different sizes and shapes, and with different lead configurations and numbers, to the printed circuit board.

Positioning of the individual soldering head assemblies 1 along the guide bars 3 may be accomplished by manually moving the heads by a positioning device, such as a stepped template 8, or by two opposite-pitch lead screws 11 and 12. The stepped template 8 rides in a guide 7, with stop rods 9 limiting the inward movement of the head assemblies 1. The stop rods are held in position by springs, such as the spring 10. The opposite-pitch lead screws 11 and 12 drive nut assemblies 13 and 14 and, therefore, drive the head assemblies 1 to the desired longitudinal positions. The lead screws 11 and 12 can be driven manually as suggested above; or automatically, for example, by a stepping motor 15.

In the same manner, the joint movement of the head assemblies 1 in the lateral direction along the guide bars, such as guide bar 6 can be controlled using a manual assembly consisting, for example, of a stylus pin 41 which can be placed in any one of several locating holes in a positioning block 42. Movement in the lateral direction can also be accomplished by appropriate lead screws, similar to the lead screws 11 and 12, and associated components, not shown.

Figure 2:
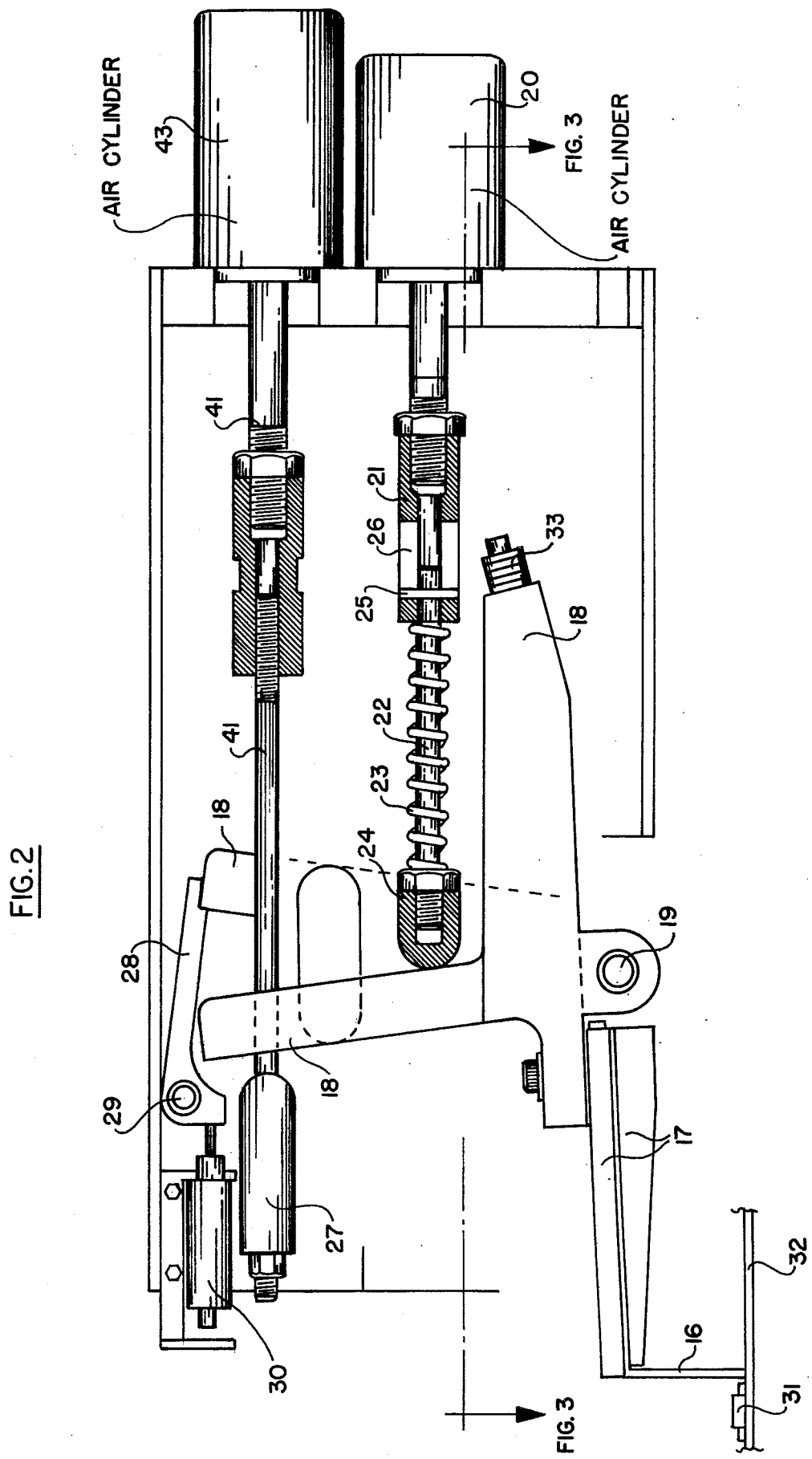
FIG. 2 is a section of one of the soldering head assemblies taken essentially along the line 2—2 of FIG. 1.
Figure 3:
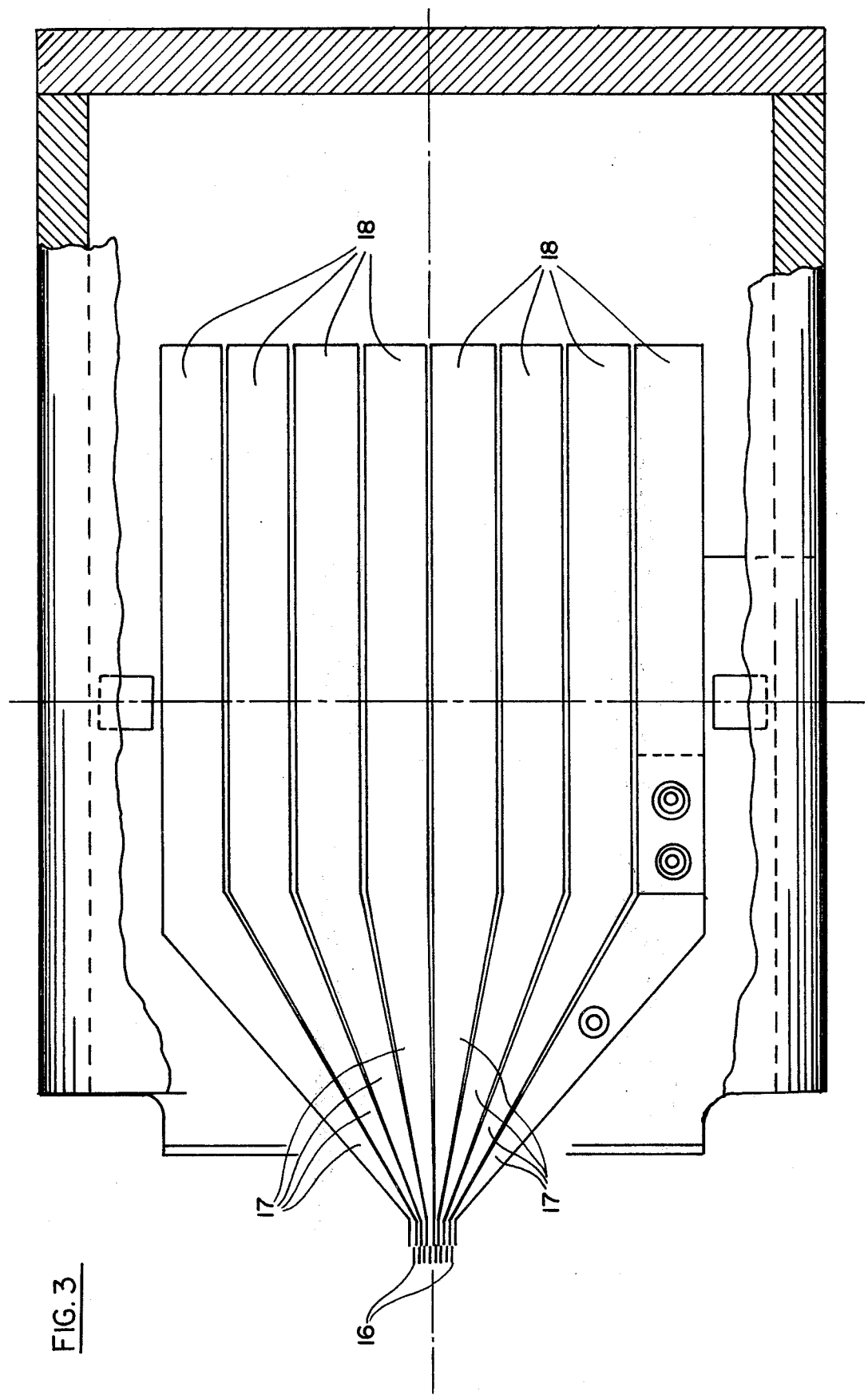
FIG. 3 is a further section taken essentially along the line 3—3 of FIG. 2.

The construction and operation of each of the two head assemblies 1 can best be understood by reference to FIGS. 2 and 3. As shown in FIGS. 2 and 3, a plurality of pivot arms 18 are pivotally mounted adjacent to one another on a pivot shaft 19. A corresponding plurality of soldering tips 16 are mounted at one of the extremities of the respective pivot arms. As shown in FIG. 2, for example, each pivot arm 18 has a crank-like configuration, and each has an actuator, in the form of an air cylinder 20 which drives an actuating block 24 against the corresponding pivot arm 18 to tend to rotate the pivot arm in a counterclockwise direction in FIG. 2.

The air cylinder 20 actuates a guide block 21. A plurality of sliding shafts 22 are supported in the guide block 21. The shafts 22 are free to move longitudinally within the guide block 21 to the extent permitted by a transversely mounted pin 25 which rides in a slot 26 in the guide block. A corresponding actuating block 24 is mounted on the left-hand extremity of each sliding shaft 22 in FIG. 2, and each block 24 is held in an extended position against the pivot arm 18 by means of a spring 23.

A corresponding plurality of tripper bars 28 are mounted on a shaft 29 in the frame of the mechanism. These tripper bars normally engage the respective pivot arms and hold the arms in their right-hand position, as shown in FIG. 2. So long as the tripper bars 28 are in position, operation of the actuators 24 has no effect on the respective pivot arms, instead, the actuators are forced back against the force of the corresponding springs 23.

A plurality of solenoids 33 are mounted on the head, corresponding in number to the number of tripper bars 28, and these solenoids may be independently energized to release the tripper bars 28 on a selective basis. Whenever a tripper bar 28 is released, the corresponding pivot arm 18 is then free to move in a counterclockwise direction as it is engaged by the corresponding actuating block 24.

A second air cylinder 43 is coupled to a transverse bar 27 through a shaft 41. When the air cylinder 43 is operated, the transverse actuator bar 27 moves to the right in FIG. 2 against the pivot arms 18 and turns the pivot arms in a clockwise direction until they are all again locked by the respective tripper bars 28.

A soldering tip 16 is mounted on one extremity of each pivot arm 18 by means, for example, of a pair of electrically conductive rods 17. The rods are insulated from one another, and are electrically connected at their left-hand end in FIG. 2 by the corresponding soldering tips 16. Electric current is introduced to each soldering tip 16 from an appropriate electrical source through the two rods 17 associated therewith. It will be apparent from FIG. 2 that when each pivot arm 18 is turned in a counterclockwise direction to the position shown in FIG. 2, the corresponding soldering tip 16 is moved down against the top surface of a printed circuit board 32 to a position in which one of the leads of an electronic component 31 may be soldered to a selected conductor on the printed circuit board.

As shown in FIG. 3, the soldering tips 16 are positioned adjacent to one another so as to conform with the positions of a plurality of leads extending from one end, for example, of an integrated circuit element, such as the electronic component 31. It is apparent that the two soldering head assemblies 1 of FIG. 1 can be set to a particular longitudinal separation, so that the soldering tips 16 of the two heads are positioned over the leads of the electronic component at each end of the component.

Then, a particular number of pivot arms 18 in each head assembly 1 can be operated, corresponding to the number of leads extending from the electronic component 31. It is evident that as the head assemblies 1 are moved from position to position across the top surface of the printed circuit board 32, different lateral separations between the two heads may be effectuated, and different numbers of pivot arms 18 may be actuated, so as to conform with different sizes of electronic components on the circuit board, and different numbers of leads from the individual components.

It should also be noted that the electrical energy supplied to each soldering tip 16 through rods 17 is independent from one tip to another, so that the magnitude of the current can be changed for the various tips, if so desired. In this way an optimum soldering temperature may be set for each particular lead, as dictated by its size.

Therefore, to operate the mechanism of the invention, one of the solenoids 30 is activated for each soldering tip 16 which is to be used for any particular soldering operation. The activation of any one of the solenoids 30 lifts the corresponding tripper bar 28 clear of its pivot arm 18. Now, cylinder 43 is operated to move the turn bar 27 to the left in FIG. 2 into a position displaced from the pivot arms 18. All of the cylinders 20 are then operated, moving the guide blocks 21, the sliding shafts 22 and the actuating blocks 24 to the left in FIG. 2, and into engagement with the corresponding pivot arms 18. This action causes all pivot arms 18, which have been released from their tripper bars 28, to rotate in a counterclockwise direction about the shaft 19, lowering the corresponding soldering tips 16 to the surface of the circuit board 32.

In each instance, if a tripper bar 28 has not been lifted by its solenoid 30, then the corresponding pivot arm 18 is retained in its locked position, with its soldering tip 16 raised up from the surface of the circuit board, when the guide block 21 is moved by air cylinder 20, with the excess motion of the guide block 21 being absorbed by compression of a corresponding one of the springs 23. For all the soldering tips 16 which have been lowered by the mechanism, the force of the tips against the component leads 31, and against the surfaces of the corresponding conductors on the circuit board 32, is limited by the strength of springs 23.

If desired, the shaft 19 may be mounted in the frame of the soldering head assembly 1 by means of a linkage, such as the linkage shown in FIG. 4. Then, as the tips 16 are being lowered in the manner described above, shaft 19 is moved to the left in FIG. 4 by means of a sliding block 36, and linkages 37, 38, 39 and 40. The linkage 38 is located within the frame of the head assembly 1 in such a manner that it is moved by the actuating blocks 24 and return bar 27 in the same manner as the pivot arms 18. The result of the linkage shown in FIG. 4 is that the soldering tips 16 all trace a path during lowering and raising which maintains relatively straight line motion at the bottom of the travel and withdraws away from any tooling which may be holding the component 31 in place at the upper portion of the travel.

During the operation of each of the solder heads 1, the air cylinder 20 is retracted during the soldering operation, while the solder at the joints is still molten. This action removes the force created by the springs 23 from the pivot arms 18. After the air cylinder 20 has been retracted, removing the force created by the springs 23, the tips 16 have sufficient weight to remain in position on the component leads. A weight 33 is provided at the other extremity of each of the pivot arms 18, but this weight is insufficient to counter-balance the weight of the corresponding tip 16.

The result is that the tips 16 remain in position during the soldering operation, after the air cylinder 20 has been retracted, but with a reduced force on the joints being soldered. This reduction in force allows any stresses created by pressing the component leads tightly against the conductors on the printed circuit board 32 to be relieved prior to the solidification of the solder at the particular joint.

Due to the force reduction cycle, as described above, the component leads which are not formed exactly parallel to the corresponding conductor on the printed circuit board will have either the form shown in FIG. 5B of lead 34, or the form shown in FIG. 5C of lead 34. Specifically, either the tip or the heel of the lead has a tendency to be raised up from the plane of the printed circuit conductor 35. When the force required for proper heat transfer is supplied by the corresponding soldering tip 16, the lead 34 is pressed flat against the conductor 35 by the soldering mechanism of the invention, as shown in FIG. 5A.

However, if the solder is reflowed and cooled with the lead in the position shown in FIG. 5A, high stresses will be created within the soldered joint as the lead tends to assume its original configuration. For that reason, premature failure of solder joints which are formed without a stress relieving cycle is not uncommon, especially when the part is thermal cycled repeatedly. By use of the stress reduction cycle of the invention, the solder is melted using sufficient force to provide good heat transfer, as shown in FIG. 5A, then, the lead 34 is allowed to resume a nearly relaxed position, such as shown in FIGS. 5B or 5C, while the solder is still molten, the soldering tip 16 maintaining only adequate force to keep the lowest part of the lead in contact with the printed circuit conductor or pad 35. The electric current is then removed from the tips 16, allowing the solder to cool and harden.

As mentioned above, at the end of the soldering operation, the air cylinder 43 is retracted to cause the return bar 27 to move all of the pivot arms 18 back to their cocked position by tripper bars 28, with the corresponding soldering tips 16 moved up from the surface of the printed circuit board 32. The head assemblies 1 are then moved to the next position on the printed circuit board, and the operation is repeated.

The invention provides, therefore, an improved soldering mechanism which has the ability to adjust and position a plurality of soldering tips both in longitudinal separation and in lateral position to align the tips with the leads of a wide variety of electronic components of different sizes and shapes. The mechanism of the invention makes it possible to solder electronic components of any size or number of leads to a particular printed circuit board, without any necessity for excess time to be consumed by changing the set-up of the machine from one component to another.

The mechanism of the invention is also advantageous due to the ability to control the heat independently to each soldering tip, both for the purposes of accurate set up, and for the ability to increase or decrease the heat to any soldering tip to conform to larger or smaller thermal masses on the printed circuit board.

As described above, because of the independent travel and soldering force control provided for each soldering tip, each tip rests on its corresponding lead with the proper force for performing the soldering operation, regardless of the flatness of the printed circuit board or the evenness of solder build-up.

An important feature of the mechanism of the invention, as described above, is the stress relieving cycle which serves significantly to reduce subsequent solder joint failures.

It will be appreciated that although a particular embodiment of the invention has been shown and described, modifications may be made. It is intended in the claims to cover the modifications which come within the spirit and scope of the invention.

What is claimed is:

1. A mechanism for soldering electronic component leads to conductors on a printed circuit board, or the like, said mechanism comprising:
   a first soldering head assembly including a support frame;
   at least one pivot arm pivotally mounted on said frame;
   a soldering tip mounted on one extremity of said pivot arm;
   first actuating means mounted on said frame in position to engage said pivot arm and to turn said pivot arm in a first direction to move said soldering tip to an operative position;
   a tripper member mounted on said frame and normally engaging said pivot arm to prevent movement of said pivot arm by said actuating means;
   operating means coupled to said tripper member to move said tripper member to a position in which it releases said pivot arm; and
   means for supplying an electric current to said soldering tip to establish a soldering temperature at said tip.

2. The mechanism defined in claim 1, and which includes means for mounting said first soldering head assembly for lateral and longitudinal movement in a particular plane.

3. The mechanism defined in claim 2, and which includes a second soldering head assembly like said first soldering head assembly, and in which said last-named means mounts said second soldering head assembly for lateral movement in said particular plane with said first soldering head assembly and for longitudinal movement in said particular plane relative to said first soldering head assembly to control the longitudinal separation between the first and second soldering head assemblies.

4. The mechanism defined in claim 1, and which includes
   a plurality of said pivot arms mounted adjacent to one another on said frame for independent pivotal movement about a common pivot axis;
   a corresponding plurality of soldering tips respectively mounted on one of the extremities of the pivot arms;
   a corresponding plurality of first actuating means mounted on said frame to engage respective ones of said pivot arms to turn the respective pivot arms in a first direction so as to move the corresponding soldering tips selectively to an operative position;
   a corresponding plurality of tripper members mounted on said frame normally engaging respective ones of said pivot arms to prevent movement of said respective pivot arms by the corresponding ones of said first actuating means;
   a corresponding plurality of said operating means mounted on said frame and coupled to respective ones of said tripper members to move said tripper members selectively to a position in which they release corresponding ones of said pivot arms; and respective means for supplying electric current to respective ones of said soldering tips to establish a soldering temperature at the tips.

5. The mechanism defined in claim 1, in which said operating means includes an electrically activated solenoid.

6. The mechanism defined in claim 1, in which said first actuating means includes a spring-loaded member biased into engagement with said pivot arm.

7. The mechanism defined in claim 1, and which includes a balancing weight on the opposite extremity of said pivot arm from said soldering tip partially to compensate for the weight of said soldering tip to cause the soldering tip to remain in its operative position with reduced force after the first actuating means has been disengaged from said pivot arm.

8. The mechanism defined in claim 1, and which includes second actuating means mounted on said frame in position to engage said pivot arm and turn said pivot arm in a second direction to move the soldering tip from its first operative position after the first actuating means has been disengaged from the pivot arm.

9. The mechanism defined in claim 1, and which includes a linkage coupled to said pivot arm to cause the path of the soldering tip to be essentially linear as the soldering tip is moved towards and away from its operative position by the turning of the pivot arm.

* * * * *